United States Patent [19]

Carver

[11] Patent Number: 4,907,334
[45] Date of Patent: Mar. 13, 1990

[54] SHIELD FOR ELECTRIC METER PULLER

[76] Inventor: Terry Carver, 610 S. Julia St., Poplarville, Miss. 39470

[21] Appl. No.: 268,842

[22] Filed: Nov. 8, 1988

[51] Int. Cl.$^4$ .............................................. B25B 27/14
[52] U.S. Cl. ...................................................... 29/278
[58] Field of Search .................... 81/3.4, 3.42, 3.43, 81/64; 29/278, 270; 269/130–132

[56] References Cited

U.S. PATENT DOCUMENTS

| D. 231,776 | 6/1974 | Kannemeyer | 81/3.42 |
| 3,037,408 | 6/1962 | Rives et al. | 81/3.42 |
| 3,186,263 | 6/1965 | Grote | 81/3.4 |
| 3,482,476 | 12/1969 | Tanksley | 81/3.42 |
| 4,660,445 | 4/1987 | Windom | 81/3.43 |
| 4,697,480 | 10/1987 | Robideau | 81/3.4 |

Primary Examiner—Robert C. Watson
Attorney, Agent, or Firm—Alexander F. Norcross

[57] ABSTRACT

An emergency meter pulling shield protects emergency response personnel from inductive flashback and explosion while pulling electric meters and feeding active circuits. A cylindrical shield sized to completely enclose the meter contains an internal tension band which may be tightened around the shield of the meter and a protected handhold for pulling the meter, enclosed within the shield, free of its socket. Any flashback and explosion is contained within the shield and the personnel pulling the meter are protected.

5 Claims, 1 Drawing Sheet

SHIELD FOR ELECTRIC METER PULLER

BACKGROUND OF THE INVENTION

This patent relates to shielded structures for gripping and removing objects, while protecting the user.

The closest patent known to the inventor combining a closing structure with an internal gripping means is U.S. Pat. No. 3,124,984 to Anderson. Anderson discloses a wrench, in the sense of an object that provides a torquing motion to a cylindrical object, in which an enclosing cylindrical container has an internal friction band which is tightened by means of a roller cam against the object to be removed. However, Anderson's cam structure compressingly engages a free end of a helix against the cylindrical object and can only be used in torque. Anderson specifically mentions that separate wrenches must be provided for the two normal directions of torque (clockwise or counterclockwise). It appears that Anderson's structure would apply insufficient gripping power for a straight backwards pull.

U.S. Pat. No. 4,648,582 to Grundahl discloses various forms of strap wrenches for gripping or clamping a cylindrical object. This patent discloses a screw-tightened clamping unit in which a screw compressibly engages a continuous wirerope which is led to form the clamping member of a u-clamp. The device is described as having utility for holding a shaft for lifting.

U.S. Pat. No. 4,037,495 to Beckstead discloses a form of strap wrench using Velcro as the strap fastening means.

U.S. Pat. No. 2,959,994 discloses a cylindrical housing for fitting over and gripping a screw-on spin-up filter canister; the housing contains a precoiled spring, which has a normal position tighter than the object to be grasped. Sliding the housing over the canister expands the spring, creating a gripping force.

U.S. Pat. No. 4,307,633, another form of spin-on oil filter cylinder wrench, discloses two bands, an inner and an outer, connected through a double link arrangement which cause the bands to tighten when torque is applied to the wrench.

U.S. Pat. No. 3,853,026 to Rhodes discloses an oil filter removing tool which uses spring-loaded gripper fingers which engage into the indentations found in the side of the can.

SUMMARY OF THE INVENTION

This is a shield emergency removal device for an electric power meter.

Electric power meters are glass enclosed kilowatt hour meters which are installed through a knife plug in series with the main power lines running into a building or facility; all power to the facility passes through the meter.

The meters are normally removed by electric utilities, who are able to determine that all power has been removed in the facility and no power is flowing through the meter. However, in the event of a fire, or where emergency access has to be gained, often the only accessible method for fire or emergency response personnel to kill all power to a building is to pull the electric power meter.

Pulling a meter while current is passing through it, especially when there is an inductive load such as electric motors, air conditioners and the like, creates an inductive kickback which can dissipate in a large amount of power through the meter as it is pulled. This has resulted in meter explosions. Since electric power meters are encased in glass for easy reading, the resulting shrapnel is extremely dangerous to the emergency personnel pulling the meter.

The device is a metal shielded open-ended structure for enclosing the glass face of an electric power meter. An internal band can be tightened about the glass by means of the twist fastener, tensioning the securing strap which is riveted to one side of the case and rides freely on the circumference. The user then grasps the remote handle and pulls vertically outward.

The resulting apparatus thus allows the emergency removal of a glass encased electric power meter while containing the meter against explosive forces and eliminating the risk of injury to personnel.

DESCRIPTION OF THE PREFERRED EMBODIMENT

Figure 1:
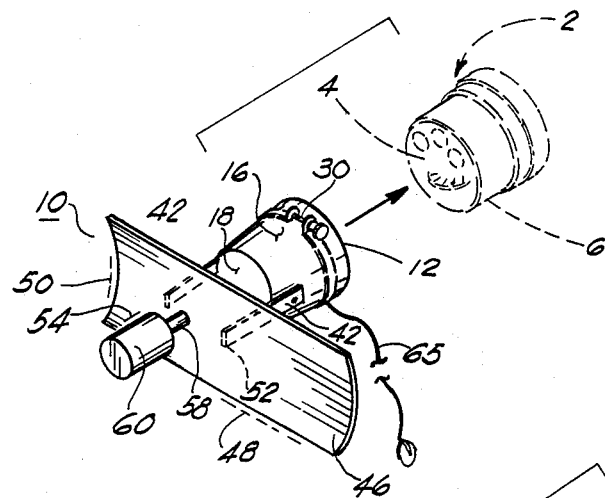
FIG. 1 is a view of the invention, showing a relationship to an electrical power meter.
Figure 2:
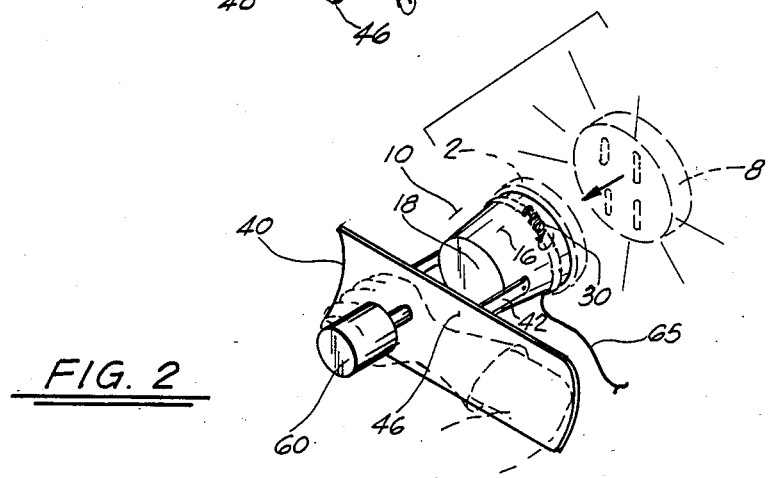
FIG. 2 is a view of the invention showing its use in withdrawing an electrical power meter.
Figure 3:
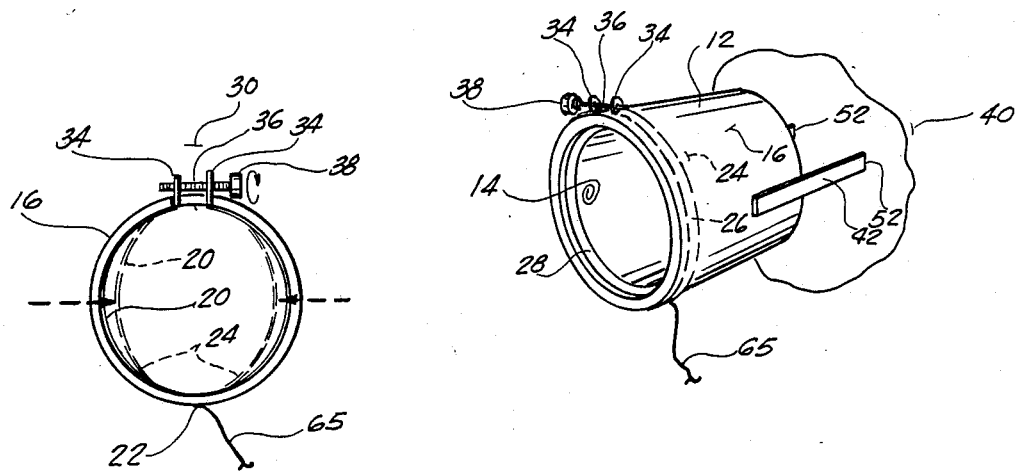
FIG. 3 is a view interior to the front of the invention.
Figure 4:
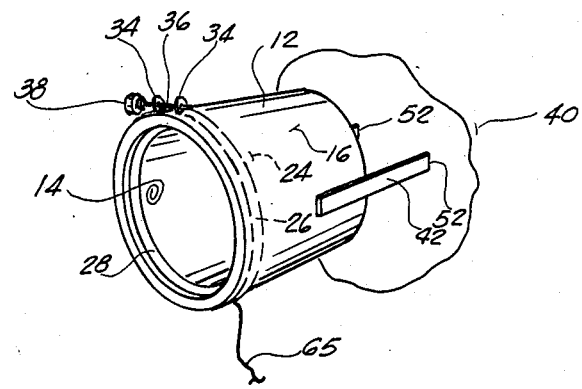
FIG. 4 is an angled view of the protective shield of the invention.

As described in the background of the invention, all power to a building or facility is, by universal design, provided in series through a standard electric power meter 2. Such electric power meters 2 have certain variations depending upon whether they are for industrial rated services or residential rated services, but they each have some form of indicator face 4 upon which there are various dials for indicating power consumption and the rate of power consumption. In order to insure that the indicator face 4 may be read, all electric power meters 2 have a transparent glass covering 6 enclosing the meter indicators and the mechanism.

Such electric power meters are physically formed as an oversized male plug fitting into a wall socket 8 through which all power to the metered facility passes. This power passes through the interior of the meter 2 in order to activate the indicators upon the indicator face 4.

There are certain detailed differences between residential meters and industrial meters which affect the design of the protector shield given below. In particular, since it is customary that industrial services are rated and charged based both on their total power consumption and upon peak power consumption at any point during a given time period, meters for industrial customers will have a resettable peak power indicator. This often takes the form of an elongate needle mounted to an exterior device through the front of the glass covering 6 covering the meter; in contrast, residential power meters invariably have a smooth, planar glass covering over the indicator face 04 of the electric power meter.

It is also found that some electric power meter glass coverings 6 are tapered while others are cylindrical in shape.

Because of the necessity of accurate, periodic measurement of electricity consumption for the purposes of ascertaining the amounts charged, utilities take effort to insure that electric power meters 2 are easily located, visible and accessible. The same economic incentives insure that electric power companies maintain accurate and current records as to the location of all power meters servicing all facilities. The basic design of the power meter requires that all the power to the facility pass through the meter. For these reasons, a power meter is usually the most easily located control unit for electrical supply to a facility, and all electricity to a facility can be stopped by pulling the meter. Emergency services, therefore, such as fire or rescue, have developed a nearly universal practice of interrupting electrical power in severe emergencies by locating and pulling the power meter.

This procedure is safe only if in fact no power is being supplied to the facility at the time. Otherwise, especially if the facility contains significant inductive loads such as motor driven machinery, air conditioners and the like, the act of pulling the power meter 2 is likely to create a backflash through the mechanism of the meter. An extreme amount of energy is dissipated in the meter 2 in a very short period of time and the meter explodes; the glass covering 6 of the meter 2 becomes a particular source of dangerous particles.

Referring to the Figures, I show a protective meter puller 10 comprising, in combination, a power meter shield housing 12 having a circular opening 14 designed to enclose and cover the glass covering 6 of a typical electric power meter. A cylindrical shield 16 closed off with a shield back plate 18 matches the general form of the glass covering 6 and encloses the entire power meter 2 when placed over the meter. This is not a completely tight enclosing; such an enclosure might simply cause the shield in turn to explode in case of a backflash.

Therefore, to grip meter 2, I provide within circular shield 16 an adjustable gripper strap 20. Gripper strap 20 is fixed preferably by riveting or welding at a bottom point of affixation 22 and arises within shield 16, as two semi-circular gripping straps 24 which are loosened or tightened by tightener 30.

The semi-circular gripping straps 24 are preferably flexible metal straps 26 having a friction inner layer 28, such as rubber or the like.

Tightening mechanism 30 can be as simple as, in the preferred embodiment, a suitably small shield opening 32 through which protrude vertical screw tabs 34, formed by bending the ends of the semi-circular gripping straps 24, distal of the point of affixation 22, in an upward direction. Means are placed within these tabs for accepting a screw; these means can be as simple as welding a nut or the like or threading the tabs. A screw tightening mechanism 36 can then draw the tabs together tightening the circular gripping straps 24 about the glass covering 06 of the electric power meter 02.

Because this is an emergency device designed to be used by a member of a rescue team, who will usually be wearing heavy gloves for hand protection, an expanded, finger adapted head 38 is provided upon the screw tightener 36 to facilitate hand tightening of the screw tightener 36. Finger adaptor head 38 may take the form either of a large serrated knob or a cross bar handle, but it should be readily graspable and manipulatable by an individual wearing very heavy gloves.

Protector shield housing 12 is then fastened to the shield manipulator means 40 by means of a pair of handle straps 42 extending from shield housing 12 to a provided forearm shield 46. It is felt preferable that the protector shield be spaced a distance from the forearm shield so as to lessen the possibility of punch through in the case of a particularly violent flashback. Any suitable standoff would function in lieu of handle straps 42.

Forearm shield 46 is in shape much like a greave; that is it is a semi-circular elongate shield designed to cover the forearm from the hand to a point adjacent the elbow.

It is considered in the current invention that the forearm shield should not be necessary, but it is included within the design of the preferred embodiment as an additional precaution.

The forearm shield of the preferred embodiment has a curved cross-section 50 and a straight, elongate section 48 covering the arm from the hand to a point adjacent the elbow. The handle straps 42 are fastened to the outer point of the shield at fastening points 52.

The overall protector 10 is manipulated by means of handle mechanism 34 attached directly to forearm shield 46. Handle mechanism 54 is in general a short vertical shaft 58 ending in an expanded, glove capable hand grip 60.

In use, where it is necessary to rapidly remove electrical power from a building during an emergency, such as a fire, the protector 10 is grasped by handle 54 and shield housing 12 placed over electric power meter 2. While the user holds the protector in place, the gripper strap 20 is fastened about the glass covering 6 of the power meter by manipulating the tightener 30 to tighten the gripper straps 20. It is to be noted that the gripper straps 20 within the cylindrical shield housing 12 do not twist the meter, as the meter is not screwed into place; they rather provide a direct linear pull upon the meter without crushing the glass cover. For this reason, the cylindrical shield 16 is of a length and the gripper straps 20 are placed in a forward portion of that length so as to grip relatively close to the position of wall plug 8 along glass covering 6; that is close to the base of electric power meter 02.

This also allows for some anticipated slippage due to the formation of the gripper straps 20, which are formed as described above so as to provide for a rapid tightening, speed being of the essence in an emergency.

The tightener mechanism 30 being tightened by hand, the user then grasps the hand grip 60 in one gloved hand, the user's forearm being further shielded by the forearm shield 46. A quick linear pull then pulls the power meter 02 from the wall plug 08, interrupting power to the facility. Should a flashback occur, the force of the flash, and the resulting damage to the meter will be contained within the shield housing 12. Since the protector 10 is connected solely to the glass covering 06 of the power meter, and can further be coated with an insulating material, there is little likelihood that any electrical current would pass into the protector. Nonetheless, it is desired for safety purposes that a grounding strap 65 be connected from a point on shield housing 12 to a clip which can be directly connected to the earth safety ground provided by the electrical company, and invariably found directly beneath an electrical power meter at the point of ingress of power to a building.

As can be seen, the protector 10 of the form given provides a quick and speedy mechanism for the rapid removal of power to a building in an emergency, while protecting the emergency personnel from the effects of a possible flashback and explosion of the electric power meter when pulled.

It can thus be seen that the device is restricted not to the exact embodiment here given but to that wider range of equivalents as inherent in the claims. It is especially noted that the forearm shield of the device is not considered to be an essential and necessary element of the device but rather as a desirable expedient and additional feature.

I claim:

1. An apparatus for the safe removal of a glass enclosed electrical power device comprising:
   a. cylindrical shield means having a first generally opening receiving end and a second, shielded protected end;
   b. means within said shield means for clamping a cylindrical object;
   c. means for exerting a linear outward pull upon said shield further comprising:
      i. a circular, flexible band having a midpoint and two end points;
      ii. said midpoint being affixed at a point on the interior of said shield means;
      iii. said end points extending through a provided opening of said shield means diametrically opposite said midpoint; and
      iv. means for tightening said end points in a direction towards each other.

2. The apparatus as described in claim 1 above, wherein said means for tightening further comprises:
   a. said end points being threadedly adapted for receiving a screw;
   b. a threaded screw interlinked with said first and said second ends; and
   c. an enlarged knob means upon said threaded screw for applying torque thereto.

3. A shield for removing an electrical power meter comprising:
   a. a substantially cylindrical armored container, adapted to enclose said electric power meter;
   b. said container having a first open end for receiving said electric power meter and a second, closed, shielded end for enclosing said electric power meter;
   c. at least one strap proximate said closed end interconnecting said shield to a semi-cylindrical arm shield means;
   d. a handle means affixed to said semi-cylindrical arm shield opposite to said cylindrical shield; and
   e. means within said cylindrical shield for removably clamping said electric power meter against a linear pull force.

4. The apparatus of claim 3 above wherein said clamping means further comprises:
   a. a circular, flexible band having a midpoint and two end points;
   b. said midpoint being affixed at a point on the interior of said shield means;
   c. said end point extending through a provided opening of said shield means diametrically opposite said midpoint;
   d. means for tightening said end points in a direction towards each other.

5. The apparatus as described in claim 3 above, wherein said means for tightening further comprises:
   a. said end points being threadedly adapted for receiving a screw;
   b. a threaded screw interlinked with said first and said second ends; and
   c. an enlarged knob means upon said threaded screw for applying torque thereto.

* * * * *